US011981992B2

(12) United States Patent
Ishizaka et al.

(10) Patent No.: US 11,981,992 B2
(45) Date of Patent: May 14, 2024

(54) METHOD FOR FORMING RUSI FILM AND SUBSTRATE PROCESSING SYSTEM

(71) Applicant: Tokyo Electron Limited, Tokyo (JP)

(72) Inventors: Tadahiro Ishizaka, Nirasaki (JP); Naotaka Noro, Boise, ID (US)

(73) Assignee: TOKYO ELECTRON LIMITED, Tokyo (JP)

(*) Notice: Subject to any disclaimer, the term of this patent is extended or adjusted under 35 U.S.C. 154(b) by 0 days.

(21) Appl. No.: 16/929,333

(22) Filed: Jul. 15, 2020

(65) Prior Publication Data

US 2021/0017642 A1 Jan. 21, 2021

(30) Foreign Application Priority Data

Jul. 16, 2019 (JP) ................................ 2019-131423

(51) Int. Cl.
*C23C 16/04* (2006.01)
*C23C 16/02* (2006.01)
(Continued)

(52) U.S. Cl.
CPC ........ *C23C 16/045* (2013.01); *C23C 16/0209* (2013.01); *C23C 16/18* (2013.01);
(Continued)

(58) Field of Classification Search
CPC ... C23C 16/045; C23C 16/18; C23C 16/4488; C23C 16/52; C23C 16/455; C23C 16/0209; C23C 30/00; C23C 28/023; C23C 16/54; C23C 16/45523; C23C 16/24; C23C 16/16; C23C 16/42; C23C 16/45525; H01L 21/28518; H01L 21/76898; H01L 21/28556; H01L 21/76858;
(Continued)

(56) References Cited

U.S. PATENT DOCUMENTS

2002/0076507 A1* 6/2002 Chiang ............ C23C 16/45561 427/569
2004/0187784 A1* 9/2004 Sferlazzo .......... C23C 16/45508 118/719
(Continued)

FOREIGN PATENT DOCUMENTS

JP H10-172955 A 6/1998
JP 2002-524847 A 8/2002
(Continued)

OTHER PUBLICATIONS

Tuchscherer, et al., "Ruthenocenes and Half-Open Ruthenocenes: Synthesis, Characterization, and Their Use as CVD Precursors for Ruthenium Thin Film Deposition", Eur. J. Inorg. Chem., pp. 4867-4876, 2012.

*Primary Examiner* — Michael G Miller
(74) *Attorney, Agent, or Firm* — Nath, Goldberg & Meyer; Jerald L. Meyer; Tanya E. Harkins

(57) ABSTRACT

A method of forming a RuSi film, the method includes adsorbing silicon in a recess that is formed in a substrate and includes an insulating film by supplying a silicon-containing gas to the substrate, forming a Ru film in the recess by supplying a Ru-containing precursor to the recess in which the silicon is adsorbed, and forming a RuSi film by supplying a silicon-containing gas to the recess in which the Ru film is formed.

4 Claims, 10 Drawing Sheets

Start

Exposing substrate to silicon-containing gas — S11

Forming Ru film on substrate — S12

Exposing Ru film to silicon-containing gas — S13

End

(51) Int. Cl.
*C23C 16/18* (2006.01)
*C23C 16/448* (2006.01)
*C23C 16/455* (2006.01)
*C23C 16/52* (2006.01)
*H01L 21/285* (2006.01)

(52) U.S. Cl.
CPC ........ *C23C 16/4488* (2013.01); *C23C 16/455* (2013.01); *C23C 16/52* (2013.01); *H01L 21/28518* (2013.01)

(58) Field of Classification Search
CPC ......... H01L 21/32051; H01L 21/76843; H01L 21/68792; H01L 21/68742; H01L 21/37109; H01L 21/67167; H01L 21/76855; H01L 28/75
See application file for complete search history.

(56) References Cited

U.S. PATENT DOCUMENTS

2007/0287300 A1 12/2007 Rueger et al.
2008/0020934 A1* 1/2008 Yoshii ................ C23C 16/0209 257/E21.582
2008/0213478 A1* 9/2008 Matsuura .......... C23C 16/45546 427/255.28
2009/0257170 A1* 10/2009 Bhat ....................... H01L 28/65 361/311
2009/0266296 A1 10/2009 Tachibana et al.
2011/0165780 A1 7/2011 Kanjolia
2014/0127887 A1* 5/2014 Kraus .............. C23C 16/45534 438/478
2015/0030782 A1 1/2015 Ivanov et al.
2015/0235959 A1 8/2015 Lee et al.
2018/0155379 A1 6/2018 Schmiege et al.
2018/0254181 A1 9/2018 Ishizaka
2019/0185993 A1* 6/2019 Chen ....................... C23C 16/04

FOREIGN PATENT DOCUMENTS

JP 2007-115797 A 5/2007
JP 2007-258390 A 10/2007
JP 2011-522124 A 7/2011
JP 2012-519777 A 8/2012
JP 2012-172171 A 9/2012
JP 2018-26495 A 2/2018
JP 2018-147949 A 9/2018

* cited by examiner 102
502
503
504
502a
W
520
514
505
506
507
508
508a
501b
519
505a
509
515a
515
516
516a
510
517a
517
515b
511
512
513
518
501a
501

METHOD FOR FORMING RUSI FILM AND SUBSTRATE PROCESSING SYSTEM

CROSS-REFERENCE TO RELATED APPLICATION

This application is based upon and claims the benefit of priority from Japanese Patent Application No. 2019-131423, filed on Jul. 16, 2019, the entire contents of which are incorporated herein by reference.

TECHNICAL FIELD

The present disclosure relates to a method for forming a RuSi film and a substrate processing system.

BACKGROUND

There has been known a technique in which a RuSix layer is used as a diffusion barrier layer used to prevent one material from diffusing into an adjacent material (see, for example, Patent Document 1).

PRIOR ART DOCUMENT

Patent Document

Japanese Laid-Open Patent Publication No. 2002-524847

SUMMARY

According to the embodiments of the present disclosure, there is provided a method of forming a RuSi film, the method including: adsorbing silicon in a recess that is formed in a substrate and includes an insulating film by supplying a silicon-containing gas to the substrate; forming a Ru film in the recess by supplying a Ru-containing precursor to the recess in which the silicon is adsorbed; and forming a RuSi film by supplying a silicon-containing gas to the recess in which the Ru film is formed.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
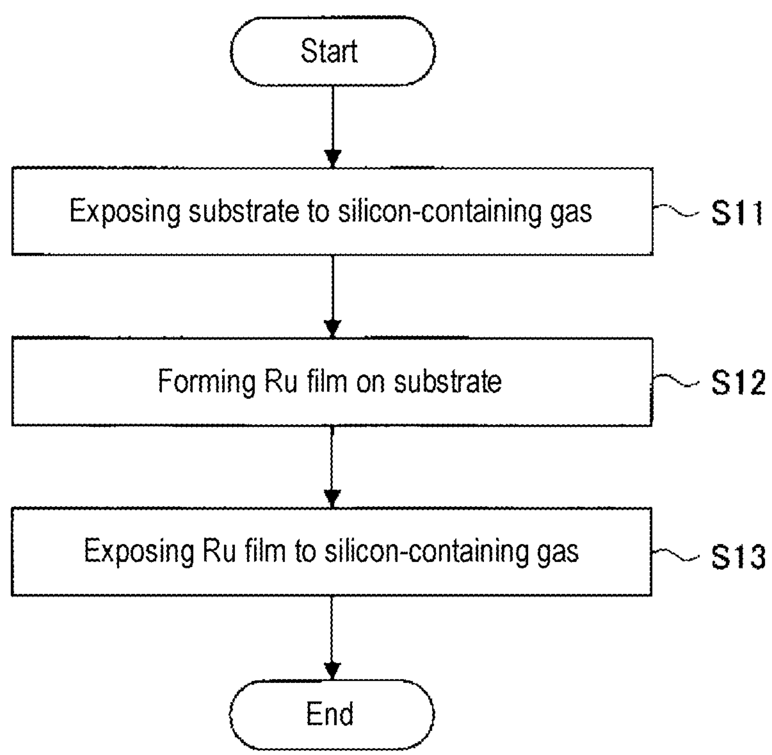
FIG. 1 is a flowchart illustrating a method of forming a RuSi film according to an embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, non-limiting exemplary embodiments of the present disclosure will be described with reference to the accompanying drawings. In all the accompanying drawings, the same or corresponding members or components will be denoted by the same or corresponding reference numerals, and redundant explanations will be omitted.

[Regarding RuSi Film]

With the miniaturization of semiconductor devices, the miniaturization of wiring is also advancing. Therefore, a ruthenium silicide (RuSi) film has been studied as a wiring material. Unlike a copper (Cu) film, the RuSi film is unlikely to diffuse into an insulating film, and thus an underlying film of the RuSi film is not required to have a barrier property. However, it is required to form the RuSi film directly on the insulating film with good adhesion.

When forming a RuSi film, for example, $\eta^4$-2,3-dimethylbutadiene ruthenium tricarbonyl ($Ru(DMBD)(CO)_3$) and dodecacarbonyltriruthenium ($Ru_3(CO)_{12}$) are used as Ru-containing precursors.

When $Ru(DMBD)(CO)_3$ is used, it is possible to directly form a RuSi film on an insulating film with good adhesion and good step coverage. However, since oxygen ($O_2$) gas is required in addition to $Ru(DMBD)(CO)_3$, oxygen (O) is easily incorporated as an impurity in the formed RuSi film. In addition, carbon (C) resulting from $Ru(DMBD)(CO)_3$ is easily incorporated as an impurity in the formed RuSi film. Therefore, it is difficult to form a RuSi film with high purity (low impurity concentration).

When using $Ru_3(CO)_{12}$, it is difficult to form a RuSi film directly on an insulating film with good adhesion. In addition, since the $Ru_3(CO)_{12}$ is a raw material gas having a low vapor pressure, it is difficult to supply $Ru_3(CO)_{12}$ at a large flow rate. Therefore, when a RuSi film is formed in a recess having a high aspect ratio, $Ru_3(CO)_{12}$ does not reach the bottom of the recess, and thus it is difficult to form a RuSi film with good step coverage in a recess having a high aspect ratio.

Therefore, as a result of intensive studies on the problems of this technique, the present inventors have found that it is possible to form a RuSi film having good step coverage and high purity by supplying a Ru-containing precursor so as to form the Ru film after causing silicon (Si) to be adsorbed on an insulating film. Hereinafter, a RuSi film-forming method capable of forming a RuSi film having good step coverage and high-purity will be described in detail.

[Method of Forming RuSi Film]

A method of forming a RuSi film according to an embodiment will be described. FIG. 1 is a flowchart illustrating a method of forming a RuSi film according to an embodiment.

FIGS. 2A to 2D are cross-sectional views illustrating steps of the method of forming a RuSi film according to the embodiment.

The RuSi film-forming method according to the embodiment includes a step of exposing a substrate to a silicon-containing gas (step S11), a step of forming a Ru film on the substrate (step S12), and a step of exposing the Ru film to a silicon-containing gas (step S13). Before and after each of steps S11 to S13, a purging step of supplying an inert gas, such as nitrogen ($N_2$) gas or argon (Ar) gas, to purge the inside of a processing container may be performed. In addition, after step S11, step S12 and step S13 may be repeated. Each step will be described below.

Figure 2A:
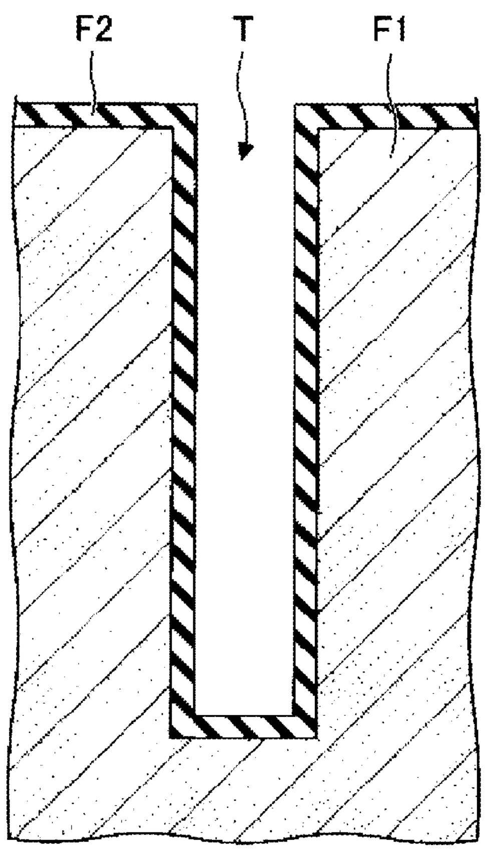
FIGS. 2A to 2D are cross-sectional views illustrating steps of the method of forming a RuSi film according to the embodiment.
Figure 2B:
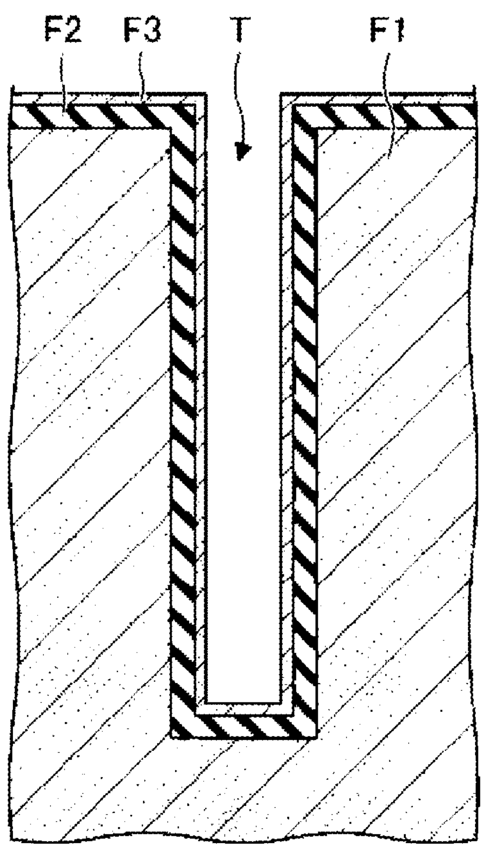

In step S11, a substrate having a recess including an insulating film is accommodated in a depressurizable processing container, and, in the state in which the substrate is heated to a predetermined temperature, a silicon-containing gas is supplied into the processing container so as to cause silicon to be adsorbed in the recess. In step S11, by supplying the silicon-containing gas to the recess T having an insulating film F2 formed on the surface thereof as illustrated in FIG. 2A, silicon F3 is conformally adsorbed in the recess T as illustrated in FIG. 2B.

The substrate is, for example, a Si wafer. The recess is, for example, a trench or a hole. The silicon-containing gas is, for example, hydrogenated silicon gas such as monosilane ($SiH_4$) gas or disilane ($Si_2H_6$) gas, monomethylsilane, dimethylsilane, or trimethylsilane. The predetermined temperature may be a temperature at which the silicon F3 is adsorbed in the recess T, and may be set depending on the type of the silicon-containing gas. For example, when $SiH_4$ gas is used as the silicon-containing gas, a suitable temperature range is 300 degrees C. to 500 degrees C., for example, 400 degrees C.

As the method of supplying the silicon-containing gas into the processing container, for example, a method of supplying the silicon-containing gas stored in a storage tank into the processing container by opening and closing a valve provided between the processing container and the storage tank may be used. When the silicon-containing gas stored in the storage tank is supplied into the processing container by opening and closing the valve provided between the processing container and the storage tank, as described above, the flow rate and velocity of the silicon-containing gas may be controlled depending on the opening/closing time and frequency of the valve. Therefore, the controllability of the flow rate and velocity of the silicon-containing gas is improved. In addition, by temporarily storing the silicon-containing gas in the storage tank and supplying the silicon-containing gas into the processing container in a pressurized state, $SiH_4$ gas reaches the bottom of the recess T, and thus the silicon F3 is likely to be conformally adsorbed to the recess T3.

As the method of supplying the silicon-containing gas into the processing container, for example, a method of continuously supplying the silicon-containing gas into the processing container may be used. In other words, a method of supplying the silicon-containing gas into the processing container without storing the silicon-containing gas in the storage tank may be used. When the silicon-containing gas is supplied into the processing container without being stored in the storage tank as described above, it is possible to continuously supply the silicon-containing gas, and thus to cause silicon to be adsorbed to the recess in a short time.

Figure 2C:
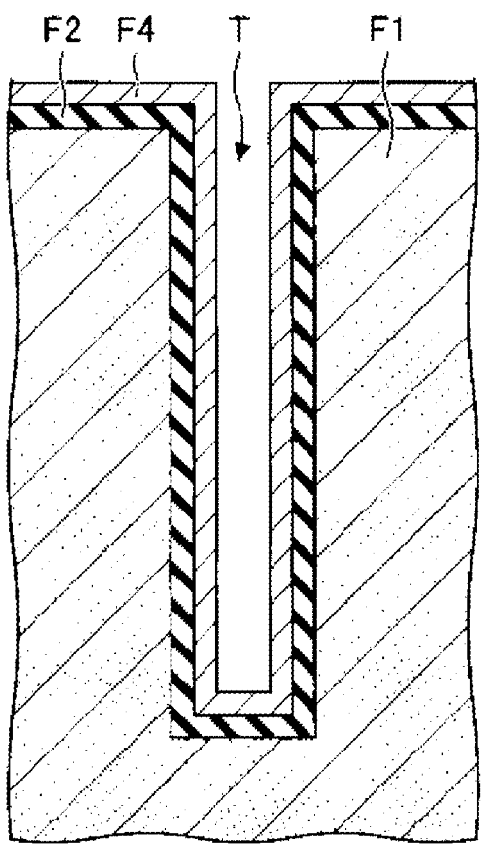

In step S12, the substrate having silicon adsorbed in the recess is accommodated in the depressurizable processing container, and in the state in which the substrate is heated to a predetermined temperature, a gasified Ru-containing precursor is supplied into the processing container so as to form a Ru film in the recess. In step S12, the silicon F3 adsorbed in the recess T functions as an adsorption site for the Ru-containing precursor, and thus the Ru-containing precursor is chemically adsorbed onto the silicon F3. In this case, since the silicon F3 is conformally formed in the recess T, the Ru film F4 is also conformally formed in the recess T as illustrated in FIG. 2C. In addition, some of the Ru film F4 is chemically adsorbed with the silicon F3 to form a RuSi film. Hereinafter, the gasified Ru-containing precursor is also simply referred to as a Ru-containing precursor.

The Ru-containing precursor is, for example, $Ru_3(CO)_{12}$ or cis-dicarbonyl bis(5-methylhexane-2,4-dionate)ruthenium(II). The predetermined temperature may be a temperature at which the Ru-containing precursor thermally decomposes, and may be set depending on the type of the Ru-containing precursor. For example, when using $Ru_3(CO)_{12}$ as the Ru-containing precursor, a suitable temperature range is 150 degrees C. to 200 degrees C., for example, 185 degrees C.

As the method of supplying the Ru-containing precursor into the processing container, for example, a method of continuously supplying the Ru-containing precursor into the processing container, may be used. In other words, a method of supplying the Ru-containing precursor into the processing container without storing the Ru-containing precursor in the storage tank may be used. Thus, when the Ru-containing precursor is supplied into the processing container without being stored in the storage tank, it is possible to continuously form the Ru film, and thus a film-forming rate is improved.

In addition, as the method of supplying the Ru-containing precursor into the processing container, for example, a method of supplying the Ru-containing precursor stored in the storage tank into the processing container by opening and closing a valve provided between the processing container and the storage tank, may be used. When the Ru-containing precursor stored in the storage tank is supplied into the processing container by opening and closing the valve provided between the processing container and the storage tank, as described above, it is possible to adjust the film thickness stepwise depending on the opening/closing time and frequency of the valve, and thus film thickness controllability is improved.

Figure 2D:
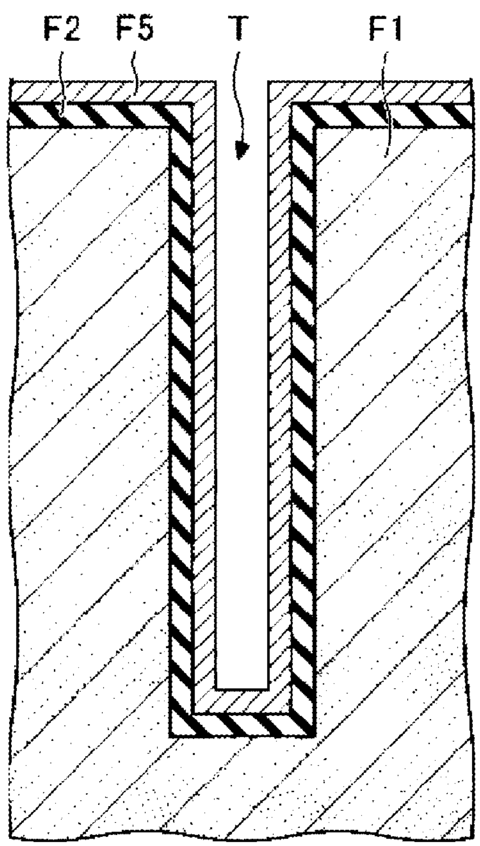

In step S13, the substrate having a Ru film formed in the recess is accommodated in the depressurizable processing container, and in the state in which the substrate is heated to a predetermined temperature, a silicon-containing gas is supplied into the processing container so as to form a RuSi film. In step S13, by supplying the silicon-containing gas to the substrate F1 having the Ru film F4 formed in the recess T, the Ru film F4 formed in the recess T is reacted with the silicon-containing gas so as to form a RuSi film F5 as illustrated in FIG. 2D. In this case, since the Ru film F4 is conformally formed in the recess T, the RuSi film F5 is also conformally formed in the recess T.

The silicon-containing gas may be the same as the gas used in step S11, and is, for example, a hydrogenated silicon gas such as $SiH_4$ gas or $Si_2H_6$ gas, monomethylsilane, dimethylsilane, or trimethylsilane. The predetermined temperature may be any temperature as long as the temperature enables the silicon-containing gas to react with the Ru film formed in the recess to form the RuSi film, and may be set depending on the type of the silicon-containing gas. For example, when $SiH_4$ gas is used as the silicon-containing gas, a suitable temperature range is 300 degrees C. to 500 degrees C., for example, 400 degrees C.

As the method of supplying the silicon-containing gas into the processing container, as in step 11, for example, a method of supplying the silicon-containing gas stored in a storage tank into the processing container by opening and closing a valve provided between the processing container and the storage tank may be used. When the silicon-containing gas stored in the storage tank is supplied into the processing container by opening and closing the valve provided between the processing container and the storage tank, as described above, the flow rate and velocity of the silicon-containing gas may be controlled depending on the opening/closing time and frequency of the valve. Therefore, the controllability of the flow rate and velocity of the silicon-containing gas is improved. In addition, after the valve is opened and a gas mass is introduced into the processing container, the valve is closed in a short time. Thus, compared to the case where the gas is continuously supplied, since it is not being affected by the pressure of the subsequent gas, the gas mass diffuses more evenly within the process container. As a result, in-plane uniformity of silicidation is improved.

As the method of supplying the silicon-containing gas into the processing container, as in step S11, for example, a method of continuously supplying the silicon-containing gas into the processing container may be used. In other words, a method of supplying the silicon-containing gas into the processing container without storing the silicon-containing gas in the storage tank may be used. When the silicon-containing gas is supplied into the processing container without being stored in the storage tank as described above, it is possible to continuously supply the silicon-containing gas, and thus a silicidation rate is improved.

By performing step S11, step S12, and step S13 described above in that order, it is possible to form a RuSi film in the recess T.

According to a RuSi film-forming method according to an embodiment, the insulating film is exposed to the silicon-containing gas in step S11 before the Ru film is formed on the insulating film in step S12. As a result, a silicon film is formed on the insulating film, and the silicon film functions as an adsorption site for the Ru-containing precursor, and thus, it is possible to form a Ru film and a RuSi film on the insulating film.

According to a RuSi film-forming method of an embodiment, the substrate is exposed to a silicon-containing gas in step S11 so as to conformally form a silicon film in the recess. As a result, the Ru film is formed from the Ru-containing precursor using the silicon film conformally formed in the recess as an adsorption site, and thus it is possible to conformally form the Ru film in the recess. That is, it is possible to form the Ru film and the RuSi film in the recess with good step coverage.

In addition, according to the RuSi film-forming method of an embodiment, $Ru_3(CO)_{12}$ and cis-dicarbonyl bis(5-methylhexane-2,4-dionate)ruthenium (II) are used as the Ru-containing precursor, and thus $O_2$ gas is not required to form a Ru film and a RuSi film. Therefore, O is unlikely to be incorporated as an impurity in a Ru film and a RuSi film that are formed. As a result, it is possible to form a Ru film and a RuSi film having a low impurity concentration.

[Substrate Processing System]

Figure 3:
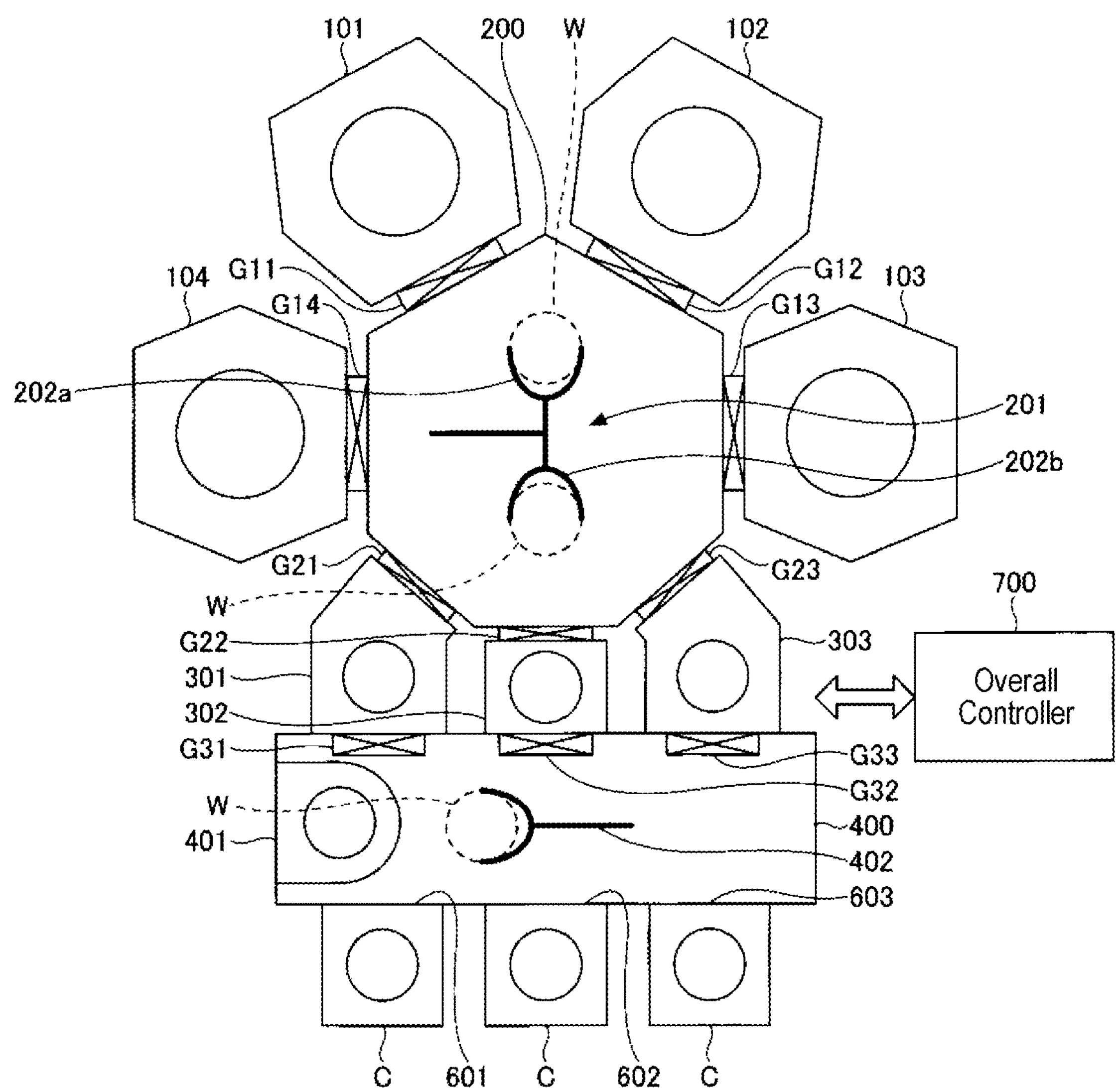
FIG. 3 is a schematic view illustrating an exemplary configuration of a substrate processing system.

An exemplary substrate processing system that realizes a RuSi film-forming method of an embodiment will be described. FIG. 3 is a schematic view illustrating an exemplary configuration of a substrate processing system.

As illustrated in FIG. 3, the substrate processing system includes processing apparatuses 101 to 104, a vacuum transport chamber 200, load-lock chambers 301 to 303, an atmospheric transport chamber 400, load ports 601 to 603, and an overall controller 700.

The processing apparatuses 101 to 104 are connected to the vacuum transport chamber 200 via gate valves G11 to G14, respectively. The insides of the processing apparatuses 101 to 104 are depressurized to a predetermined vacuum atmosphere, so that desired processing is performed on wafers W therein. In an embodiment, the processing apparatus 101 is an apparatus capable of forming a Si film, and the processing apparatuses 102 to 104 are apparatuses capable of forming a Ru film. However, each of the processing apparatuses 101 to 104 may be configured as an apparatus capable of forming a Ru film and a Si film. In addition, some of the processing apparatuses 102 to 104 may be configured as apparatuses that perform separate processing. In addition, the processing apparatuses 103 and 104 may be configured as apparatuses capable of forming a Si film, and the processing apparatuses 101 and 102 may be configured as apparatuses capable of forming a Ru film. The processing apparatus may be appropriately configured in consideration of, for example, productivity and operating rate.

The interior of the vacuum transport chamber 200 is decompressed to a predetermined vacuum atmosphere. The vacuum transport chamber 200 is provided with a transport mechanism 201 capable of transporting wafers W in the depressurized state. The transport mechanism 201 transports wafers W to the processing apparatuses 101 to 104 and the load-lock chambers 301 to 303. The transport mechanism 201 has, for example, two independently movable transport arms 202*a* and 202*b*.

The load-lock chambers 301 to 303 are connected to the vacuum transport chamber 200 through gate valves G21 to G23, respectively, and connected to the atmospheric transport chamber 400 through the gate valves G31 to G33, respectively. The inside of each of the load-lock chambers 301 to 303 is configured to be capable of being switched between an air atmosphere and a vacuum atmosphere.

The inside of the atmospheric transport chamber 400 is in the air atmosphere, and, for example, downflow of clean air is formed in the atmospheric transport chamber 400. In the atmospheric transport chamber 400, an aligner 401 is provided to perform alignment of a wafer W. In addition, the atmospheric transport chamber 400 is provided with a transport mechanism 402. The transport mechanism 402 transports wafers W to the load-lock chambers 301 to 303, carriers C in the load ports 601 to 602 described later, and the aligner 401.

The load ports 601 to 603 are provided in the lengthwise wall of the atmospheric transport chamber 400. A carrier C in which wafers W are accommodated or an empty carrier C is mounted in each of the load ports 601 to 603. As the carriers C, for example, front opening unified pods (FOUPs) may be used.

The overall controller 700 controls respective parts of the substrate processing system. For example, the overall controller 700 executes the operation of the processing apparatuses 101 to 104, the operation of the transport mechanisms 201 and 402, the opening/closing of the gate valves G11 to G14, G21 to G23, and G31 to G33, and the switching of the atmospheres in the load-lock chambers 301 to 303. The overall controller 700 may be, for example, a computer.

[Processing Apparatus]

Figure 4:
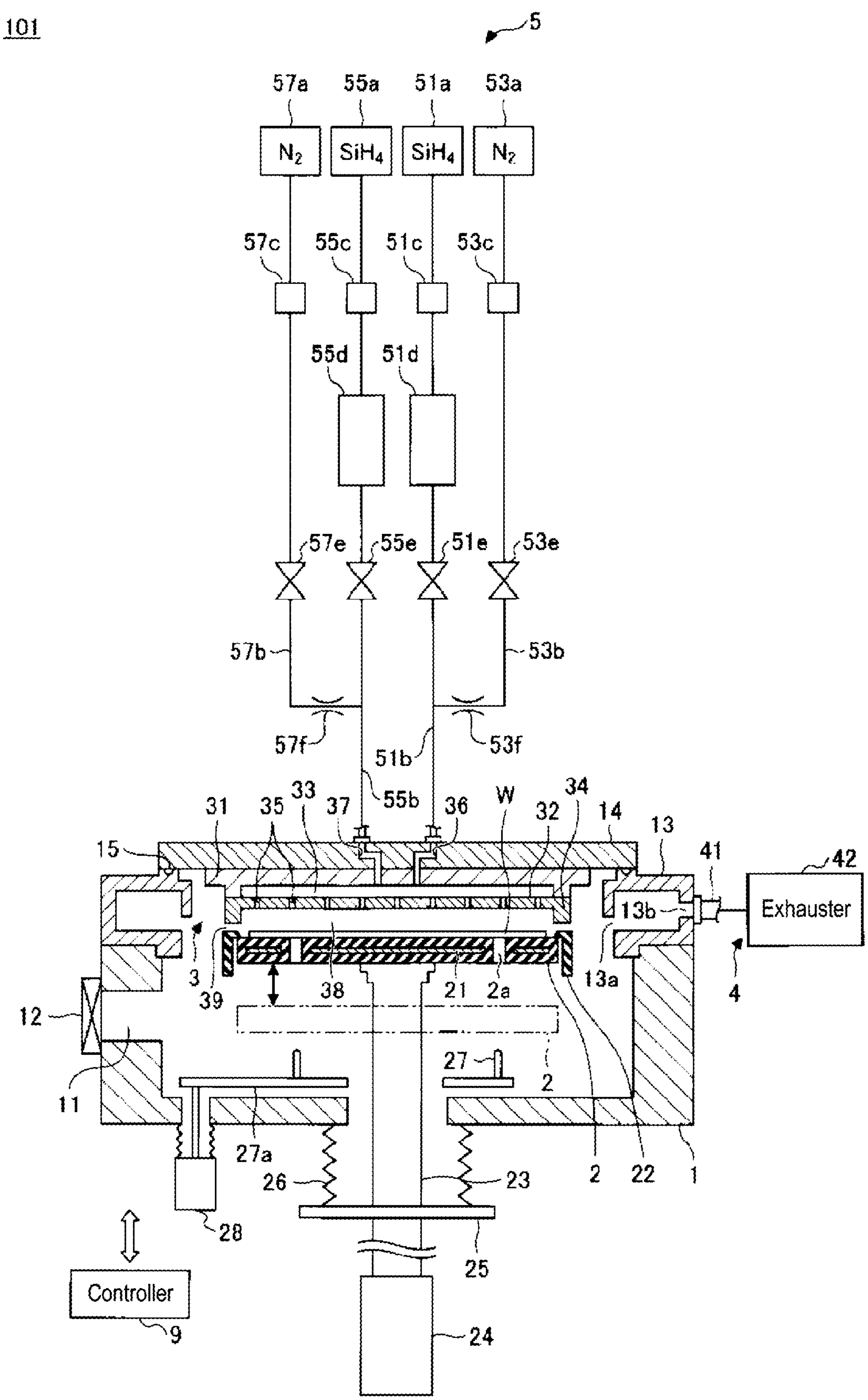
FIG. 4 is a schematic view illustrating an exemplary processing apparatus included in the substrate processing system.

An exemplary configuration of the processing apparatus 101 included in the above-described substrate processing system will be described. FIG. 4 is a schematic view illustrating an exemplary processing apparatus included in the substrate processing system. The processing apparatus 101 illustrated in FIG. 4 is an apparatus that performs, for example, a step of exposing a substrate to a silicon-containing gas (step S11) and a step of exposing a Ru film to a silicon-containing gas (step S13).

As illustrated in FIG. 4, the processing apparatus 101 has a processing container 1, a stage 2, a shower head 3, an exhaust part 4, a gas supply mechanism 5, and a controller 9.

The processing container 1 is made of a metal such as aluminum, and has a substantially cylindrical shape. The processing container 1 accommodates a wafer W. A loading/unloading port 11 is formed in the side wall of the processing container 1 to load/unload a wafer W therethrough, and is opened/closed by a gate valve 12. FIG. 3 illustrates the gate valve 12 as the gate valve G11. An annular exhaust duct 13 having a rectangular cross section is provided on the main body of the processing container 1. The exhaust duct 13 has a slit 13*a* formed along the inner peripheral surface thereof. An exhaust port 13*b* is formed in the outer wall of the exhaust duct 13. On the top surface of the exhaust duct 13, a ceiling wall 14 is provided so as to close the upper opening of the processing container 1. A space between the exhaust duct 13 and the ceiling wall 14 is hermetically sealed with a seal ring 15.

The stage 2 horizontally supports the wafer W in the processing container 1. The stage 2 is formed in a disk shape having a size corresponding to the wafer W, and is supported by a support member 23. The stage 2 is formed of a ceramic material such as AlN or a metal material such as aluminum or nickel alloy, and a heater 21 is embedded in the stage 2 in order to heat the wafer W. The heater 21 is heated by being supplied with power from a heater power supply (not illustrated). Then, the wafer W is controlled to a predetermined temperature by controlling the output of the heater 21 by a temperature signal of a thermocouple (not illustrated) provided in the vicinity of the top surface of the stage 2. The stage 2 is provided with a cover member 22 formed of ceramic such as alumina so as to cover the outer peripheral area of the top surface and the side surface thereof.

A support member 23 is provided on the bottom surface of the stage 2 to support the stage 2. The support member 23 extends to the lower side of the processing container 1 through a hole formed in the bottom wall of the processing container 1 from the center of the bottom surface of the stage 2, and the lower end of the support member 23 is connected to a lifting mechanism 24. The stage 2 is raised and lowered via the support member 23 by the lifting mechanism 24 between a processing position illustrated in FIG. 4 and a delivery position indicated by the two-dot chain line below the processing position where the wafer W is capable of being transported. A flange 25 is provided on the support member 23 below the processing container 1, and a bellows 26, which partitions the atmosphere in the processing container 1 from the outside air, is provided between the bottom surface of the processing container 1 and the flange 25 to expand and contract in response to the ascending/descending movement of the stage 2.

Three wafer support pins 27 (of which only two are illustrated) are provided in the vicinity of the bottom surface of the processing container 1 to protrude upward from a lifting plate 27*a*. The wafer support pins 27 are moved up and down via the lifting plate 27*a* by a lifting mechanism 28 provided below the processing container 1. The wafer support pins 27 are inserted through the through holes 2*a* formed in the stage 2 located at the delivery position, and are configured to protrude and retract with respect to the top surface of the stage 2. By moving the wafer support pins 27 up and down in this manner, the wafer W is delivered between a transport mechanism (not illustrated) and the stage 2.

The shower head 3 supplies a processing gas into the processing container 1 in the form of a shower. The shower head 3 is made of a metal and is provided to face the stage 2. The shower head 3 has a diameter, which is substantially equal to that of the stage 2. The shower head 3 has a main body 31 fixed to the ceiling wall 14 of the processing container 1 and a shower plate 32 connected to the lower side of the main body 31. A gas diffusion space 33 is formed between the main body 31 and the shower plate 32. In the gas diffusion space 33, gas introduction holes 36 and 37 are provided through the center of the main body 31 and the ceiling wall 14 of the processing container 1. An annular protrusion 34 protruding downward is formed on the peripheral edge portion of the shower plate 32. Gas ejection holes 35 are formed in the flat surface inside the annular protrusion 34. In the state in which the stage 2 is in the processing position, a processing space 38 is formed between the stage 2 and the shower plate 32, and the top surface of the cover member 22 and the annular protrusion 34 are close to each other so as to form an annular gap 39.

The exhaust part 4 evacuates the inside of the processing container 1. The exhaust part 4 includes an exhaust pipe 41 connected to the exhaust port 13*b*, and an exhauster 42 connected to the exhaust pipe 41 and having, for example, a vacuum pump or a pressure control valve. During the processing, the gas in the processing container 1 reaches the exhaust duct 13 via the slit 13*a*, and is exhausted from the exhaust duct 13 through the exhaust pipe 41 by the exhauster 42.

The gas supply mechanism 5 supplies the processing gas into the processing container 1. The gas supply mechanism 5 includes a $SiH_4$ gas supply source 51*a*, a $N_2$ gas supply source 53*a*, a $SiH_4$ gas supply source 55*a*, and a $N_2$ gas supply source 57*a*.

The $SiH_4$ gas supply source 51*a* supplies $SiH_4$ gas, which is an example of a silicon-containing gas, into the processing container 1 through a gas supply line 51*b*. The gas supply line 51*b* is provided with a flow rate controller 51*c*, a storage tank 51*d*, and a valve 51*e* from the upstream side. The downstream side of the valve 51*e* of the gas supply line 51*b* is connected to the gas introduction hole 36. The $SiH_4$ gas supplied from the $SiH_4$ gas supply source 51*a* is temporarily stored in the storage tank 51*d* before being supplied into the processing container 1, is boosted to a predetermined pressure in the storage tank 51*d*, and is then supplied into the processing container 1. The supply and stop of the $SiH_4$ gas from the storage tank 51*d* to the processing container 1 are performed by opening/closing the valve 51*e*. By temporarily storing the $SiH_4$ gas in the storage tank 51*d* as described above, it is possible to stably supply the $SiH_4$ gas into the processing container 1 at a relatively large flow rate.

The $N_2$ gas supply source 53*a* supplies $N_2$ gas, which is a carrier gas, into the processing container 1 through a gas supply line 53*b*. The gas supply line 53*b* is provided with a flow rate controller 53*c*, a valve 53*e*, and an orifice 53*f* from the upstream side. The downstream side of the orifice 53*f* of the gas supply line 53*b* is connected to the gas supply line 51*b*. The $N_2$ gas supplied from the $N_2$ gas supply source 53*a* is continuously supplied into the processing container 1 during the film formation on the wafer W. The supply and stop of the $N_2$ gas from the $N_2$ gas supply source 53*a* to the processing container 1 are performed by opening/closing the valve 53*e*. The gas is supplied to the gas supply line 51*b* at a relatively large flow rate by the storage tank 51*d*, and the gas supplied to the gas supply line 51*b* is prevented from flowing back to the $N_2$ gas supply line 53*b* by the orifice 53*f*.

The $SiH_4$ gas supply source 55*a* supplies $SiH_4$ gas, which is a Si-containing gas, into the processing container 1 through a gas supply line 55*b*. The gas supply line 55*b* is provided with a flow rate controller 55*c*, a storage tank 55*d*, and a valve 55*e* from the upstream side. The downstream side of the valve 55*e* of the gas supply line 55*b* is connected to the gas introduction hole 37. The $SiH_4$ gas supplied from the $SiH_4$ gas supply source 55*a* is temporarily stored in the storage tank 55*d* before being supplied into the processing container 1, is boosted to a predetermined pressure in the storage tank 55*d*, and is then supplied into the processing container 1. The supply and stop of the $SiH_4$ gas from the storage tank 55*d* to the processing container 1 are performed by opening/closing the valve 55*e*. By temporarily storing the $SiH_4$ gas in the storage tank 55*d* as described above, it is possible to stably supply the $SiH_4$ gas into the processing container 1 at a relatively large flow rate.

The $N_2$ gas supply source 57*a* supplies $N_2$ gas, which is a carrier gas, into the processing container 1 through a gas supply line 57*b*. The gas supply line 57*b* is provided with a flow rate controller 57*c*, a valve 57*e*, and an orifice 57*f* from the upstream side. The downstream side of the orifice 57*f* of the gas supply line 57*b* is connected to a gas supply line 55*b*. The $N_2$ gas supplied from the $N_2$ gas supply source 57*a* is continuously supplied into the processing container 1 during the film formation on the wafer W. The supply and stop of the $N_2$ gas from the $N_2$ gas supply source 57*a* to the processing container 1 are performed by opening/closing the valve 57*e*. The gas is supplied to the gas supply line 55*b* at a relatively large flow rate by the storage tank 55*d*, and the gas supplied to the gas supply line 55*b* is prevented from flowing back to the $N_2$ gas supply line 57*b* by the orifice 57*f*.

The controller 9 is, for example, a computer, and includes, for example, a central processing unit (CPU), random access memory (RAM), read only memory (ROM), and an auxiliary storage device. The CPU operates based on a program stored in the ROM or an auxiliary storage device, and controls the operation of the processing apparatus 101. The controller 9 may be provided either inside or outside the processing apparatus 101. In the case in which the controller 9 is provided outside the processing apparatus 101, the controller 9 is capable of controlling the processing apparatus 101 through a wired or wireless communication mechanism.

An exemplary operation of the processing apparatus 101 will be described. At the start, the valves 51*e*, 53*e*, 55*e*, and 57*e* are closed, and the inside of the processing container 1 is made to have a vacuum atmosphere by the exhauster 42. In addition, the stage 2 moves to the delivery position.

The controller 9 opens the gate valve 12. Here, the wafer W is transported into the processing container 1 and placed on the stage 2 by an external transport mechanism 201 (see FIG. 3). When the transport mechanism 201 (see FIG. 3) retracts from the processing container 1, the controller 9 closes the gate valve 12. The controller 9 controls the heater 21 to heat the wafer W to a predetermined temperature. In addition, the controller 9 controls the lifting mechanism 24 to raise the stage 2 to the processing position and to form the processing space 38. Further, the controller 9 controls the pressure control valve of the exhauster 42 to adjust the inside of the processing container 1 to a predetermined pressure.

Next, the controller 9 opens the valves 53*e* and 57*e*, so as to supply a carrier gas ($N_2$ gas) of a predetermined flow rate from the $N_2$ gas supply sources 53*a* and 57*a* to the gas supply lines 53*b* and 57*b*, respectively. The controller 9 also supplies $SiH_4$ gas from the $SiH_4$ gas supply sources 51*a* and 55*a* to the gas supply lines 51*b* and 55*b*, respectively, at a predetermined flow rate. At this time, since the valves 51*e* and 55*e* are closed, the $SiH_4$ gas is stored in the storage tanks 51*d* and 55*d*, and the pressure inside the storage tanks 51*d* and 55*d* is boosted.

Next, the controller 9 opens the valve 51*e* to supply $SiH_4$ gas stored in the storage tank 51*d* into the processing container 1 so as to be adsorbed on the surface of the wafer W.

After a predetermined time elapses after opening the valve 51*e*, the controller 9 closes the valve 51*e* and opens the valve 55*e*, thereby supplying the $SiH_4$ gas stored in the storage tank 55*d* into the processing container 1 so as to be adsorbed to the surface of the wafer W. At this time, by closing the valve 51*e*, the $SiH_4$ gas supplied from the $SiH_4$ gas supply source 51*a* to the gas supply line 51*b* is stored in the storage tank 51*d*, and the pressure in the storage tank 51*d* is boosted.

After a predetermined time elapses after opening the valve 55*e*, the controller 9 closes the valve 55*e* and opens the valve 51*e*, thereby supplying the $SiH_4$ gas stored in the storage tank 51*d* into the processing container 1 so as to be adsorbed to the surface of the wafer W. At this time, by closing the valve 55*e*, the $SiH_4$ gas supplied from the $SiH_4$ gas supply source 55*a* to the gas supply line 55*b* is stored in the storage tank 55*d*, and the pressure in the storage tank 55*d* is boosted. Thereafter, by repeatedly opening the valve 51*e* and the valve 55*e* alternately, the $SiH_4$ gas is stored in the storage tanks 51*d* and 55*d* and is supplied to the processing container 1 in the boosted state.

In this way, the valves 51*e* and 55*e* are alternately opened to supply the $SiH_4$ gas, which is temporarily stored in the storage tanks 51*d* and 55*d*, into the processing container 1 in the boosted state whereby the $SiH_4$ gas reaches the bottom of the recess having a high aspect ratio.

After performing the operation of alternately opening the valve 51*e* and the valve 55*e* for a predetermined time, the controller 9 unloads the wafer W from the processing container 1 in the reverse order of the procedure for loading the wafer W into the processing container 1.

Exemplary process conditions in the step of exposing the substrate to the silicon-containing gas (step S11) and the step of exposing the Ru film to the silicon-containing gas (step S13), which are executed by the processing apparatus 101, are as follows.

(Step S11)

Temperature of wafer W: 300 to 600 degrees C.

Pressure within processing container 1: 1.33 to 1333 Pa (Step S13)

Temperature of wafer W: 300 to 600 degrees C.

Pressure within processing container 1: 1.33 to 1333 Pa

In addition, in the above example, the case in which the $SiH_4$ gas is alternately supplied into the processing container 1 from a plurality of gas supply lines 51*b* and 55*b* has been described, but the present disclosure is not limited thereto. For example, $SiH_4$ gas may be simultaneously supplied into the processing container 1 from a plurality of gas supply lines 51*b* and 55*b*.

Figure 5:
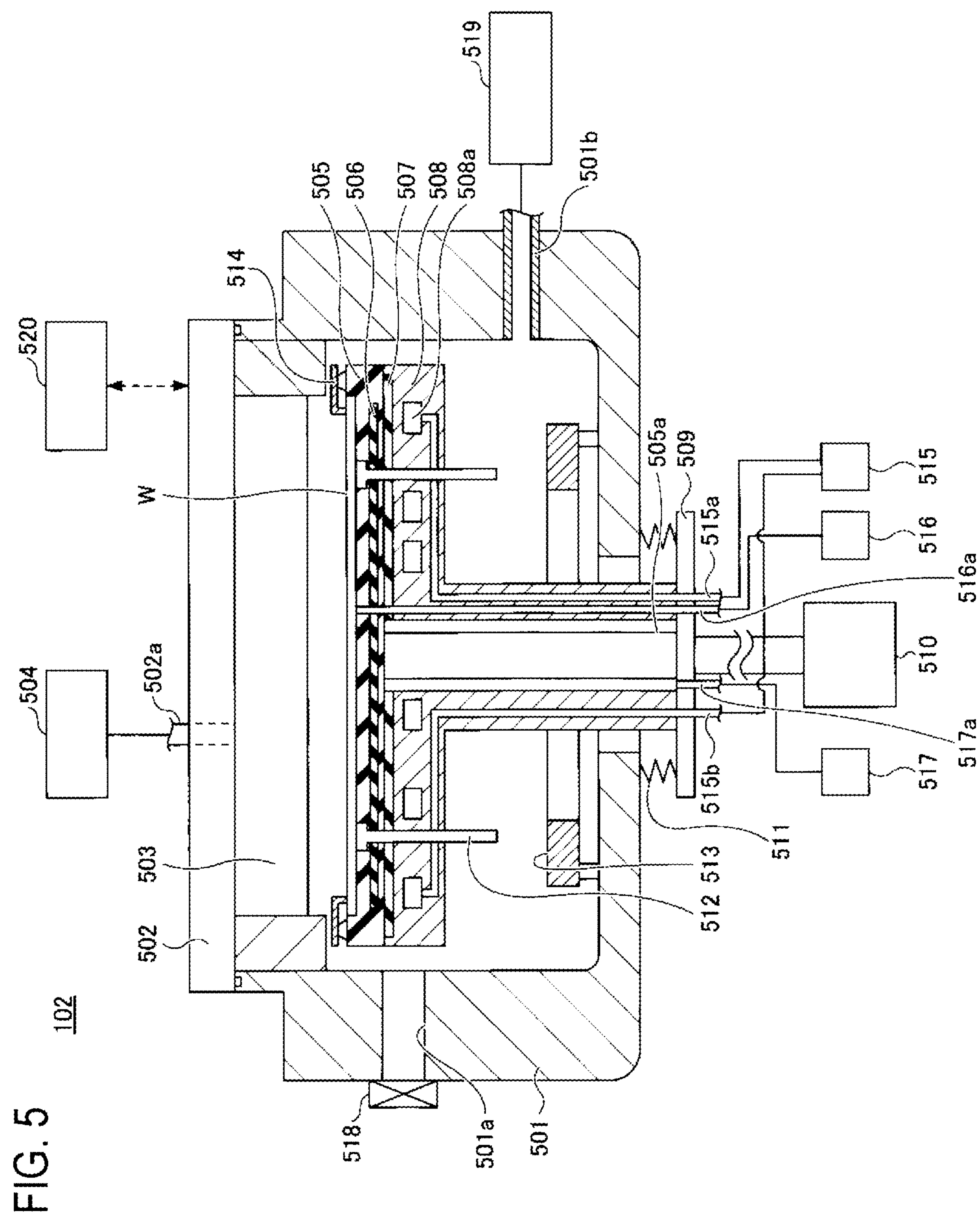
FIG. 5 is a schematic view illustrating another exemplary configuration of a processing apparatus included in the substrate processing system.

Next, an exemplary configuration of the processing apparatus 102 included in the above-described substrate processing system will be described. The processing apparatuses 103 and 104 may have the same configuration as the processing apparatus 102. FIG. 5 is a schematic view illustrating another exemplary configuration of a processing apparatus included in the substrate processing system.

The processing apparatus 102 illustrated in FIG. 5 is a chemical vapor deposition (CVD) apparatus, and is an apparatus for performing, for example, the step of forming a Ru film on a substrate (step S12). In the processing apparatus 102, for example, a Ru-containing precursor is supplied and processing for forming a Ru film on the wafer W is performed.

A main body container 501 is a bottomed container having an opening at the upper side thereof. A support member 502 supports a gas ejection mechanism 503. In addition, the support member 502 closes the upper opening of the main body container 501, and the main body container 501 is sealed to form a processing chamber. A gas supply part 504 supplies a process gas such as a Ru-containing gas or a carrier gas to the gas ejection mechanism 503 through a supply pipe 502*a* penetrating the support member 502. The Ru-containing gas and the carrier gas supplied from the gas supply part 504 are supplied from the gas ejection mechanism 503 into the main body container 501.

The stage 505 is a member on which a wafer W is placed. A heater 506 is provided inside the stage 505 to heat the wafer W. The stage 505 includes a support part 505*a,* which extends downward from the center of the bottom surface of the stage 505 and is supported at one end thereof, which penetrates the bottom portion of the main body container 501, on a lifting mechanism via a lifting plate 509. In addition, the stage 505 is fixed on a temperature control jacket 508, which is a temperature control member, via a heat-insulating ring 507. The temperature control jacket 508 has a plate fixing the stage 505, a shaft extending downward from the plate and configured to cover the support part 505*a,* and a hole penetrating the shaft from the plate.

The shaft of the temperature control jacket 508 penetrates the bottom portion of the main body container 501. The lower end portion of the temperature control jacket 508 is supported by the lifting mechanism 510 via the lifting plate 509 disposed below the main body container 501. Since a bellows 511 is provided between the bottom portion of the main body container 501 and the lifting plate 509, airtightness in the main body container 501 is also maintained even during the vertical movement of the lifting plate 509.

When the lifting mechanism 510 raises and lowers the lifting plate 509, the stage 505 raised and lowered between a processing position (see FIG. 5) at which a wafer W is processed and a delivery position (not illustrated) at which the wafer W is delivered between the stage 505 and an external transport mechanism 201 (see FIG. 3) through a loading/unloading port 501*a.*

Lifting pins 512 support the wafer W from the bottom surface of the wafer W and lift the wafer W from the placement surface of the stage 505 when the wafer W is delivered between the stage 505 and the external transport mechanism 201 (see FIG. 3). Each of the lifting pins 512 has a shaft portion and a head portion having a diameter larger than that of the shaft portion. Through holes are formed through the stage 505 and the plate of the temperature control jacket 508, and the shaft portions of the lifting pins 512 are inserted through the through holes, respectively. In addition, on the placement surface side of the stage 505, recesses are formed for accommodating the head portions of the lifting pins 512, respectively. An abutment member 513 is disposed below the lifting pins 512.

In the state in which the stage 505 is moved to the processing position of the wafer W (see FIG. 5), the head portions of the lifting pins 512 are accommodated in the recesses, and the wafer W is placed on the placement surface of the stage 505. In addition, the head portions of the lifting pins 512 are engaged in the recesses, the shaft portions of the lifting pins 512 pass through the stage 505 and the plate of the temperature control jacket 508, and the lower ends of the shaft portions of the lifting pins 512 protrude from the plate of the temperature control jacket 508. Meanwhile, in the state in which the stage 505 is moved to the delivery position (not illustrated) of the wafer W, the lower ends of the lifting pins 512 abut on the abutment member 513 and the head portions of the lifting pins 512 protrude from the placement surface of the stage 505. As a result, the head portions of the lifting pins 512 support the wafer W from the bottom surface of the wafer W, and lift the wafer W from the placement surface of the stage 505.

An annular member 514 is disposed above the stage 505. In the state in which the stage 505 is moved to the processing position of the wafer W (see FIG. 5), the annular member 514 comes into contact with the outer peripheral portion of the top surface of the wafer W, and the wafer W is pressed against the placement surface of the stage 505 by the weight of the annular member 514. Meanwhile, in the state in which the stage 505 is moved to the delivery position (not illustrated) of the wafer W, the annular member 514 is engaged with an engagement portion (not illustrated) above the loading/unloading port 501*a*. Thus, the delivery of the wafer W by the transport mechanism 201 (see FIG. 3) is not hindered.

A chiller unit 515 circulates coolant (e.g., cooling water) through a flow path 508*a* formed in the plate of the temperature control jacket 508 through pipes 515*a* and 515*b*.

A heat transfer gas supply part 516 supplies a heat transfer gas (e.g., He gas) to a space between the rear surface of the wafer W placed on the stage 505 and the placement surface of the stage 505 through a pipe 516*a*.

The purge gas supply part 517 causes a purge gas to flow through a pipe 517*a,* a gap between the support part 505*a* and the hole of the temperature control jacket 508, a flow path formed between the stage 505 and the heat insulating ring 507 and extending radially outward, and a vertical flow path formed in the outer peripheral portion of the stage 505. Then, through these flow paths, the purge gas (e.g., $CO_2$ gas) is supplied to the space between the bottom surface of the annular member 514 and the top surface of the stage 505. Thus, the process gas is prevented from flowing into the space between the bottom surface of the annular member 514 and the top surface of the stage 505, thereby preventing a film from being formed on the bottom surface of the annular member 514 or the top surface of the outer peripheral portion of the stage 505.

The side wall of the main body container 501 is provided with a loading/unloading port 501*a* for loading/unloading a wafer W therethrough and a gate valve 518 for opening/closing the loading/unloading port 501*a*. FIG. 3 illustrates the gate valve 518 as the gate valve G12.

An exhaust part 519 including, for example, a vacuum pump, is connected to the lower side wall of the main body container 501 through an exhaust pipe 501*b*. The inside of the main body container 501 is exhausted by the exhaust part 519, and the inside of the main body container 501 is set to and maintained in a predetermined vacuum atmosphere.

A control device 520 controls the operation of the processing apparatus 102 by controlling, for example, the gas supply part 504, the heater 506, the lifting mechanism 510, the chiller unit 515, the heat transfer gas supply part 516, the purge gas supply part 517, the gate valve 518, and the exhaust part 519. In addition, the control device 520 may be provided independently of the overall controller 700 (see FIG. 3), or the overall controller 700 may also serve as the control device 520.

An exemplary operation of the processing apparatus 102 will be described. At the time of starting, the inside of the main body container 501 is made to have a vacuum atmosphere by the exhaust part 519. In addition, the stage 505 is moved to the delivery position.

The control device 520 opens the gate valve 518. Here, a wafer W is placed on the lifting pins 512 by the external transport mechanism 201 (see FIG. 3). When the transport mechanism 201 (see FIG. 3) comes out of the loading/unloading port 501*a*, the control device 520 closes the gate valve 518.

The control device 520 controls the lifting mechanism 510 to move the stage 505 to the processing position. At this time, as the stage 505 is raised, the wafer W placed on the lifting pins 512 is placed on the placement surface of the stage 505. In addition, the annular member 514 comes into contact with the outer peripheral portion of the top surface of the wafer W, and presses the wafer W against the placement surface of the stage 505 by its own weight.

At the processing position, the control device 520 operates the heater 506, and controls the gas supply part 504 to supply a process gas such as a Ru-containing gas or a carrier gas from the gas ejection mechanism 503 into the main body container 501. As a result, predetermined processing, such as the processing of the step of forming the Ru film on the substrate (step S12), is performed. The gas after processing passes through the flow path on the top surface side of the annular member 514, and is exhausted by the exhaust part 519 through the exhaust pipe 501*b*.

At this time, the control device 520 controls the heat transfer gas supply part 516 to supply a heat transfer gas between the rear surface of the wafer W placed on the stage 505 and the placement surface of the stage 505. In addition, the control device 520 controls the purge gas supply part 517 to supply a purge gas between the bottom surface of the annular member 514 and the top surface of the stage 505. The purge gas passes through the flow path on the bottom surface side of the annular member 514, and is exhausted by the exhaust part 519 through the exhaust pipe 501*b*.

When the predetermined processing is completed, the control device 520 controls the lifting mechanism 510 to move the stage 505 to a delivery position. At this time, by lowering the stage 505, the annular member 514 is engaged with an engagement portion (not illustrated). In addition, when the lower ends of the lifting pins 512 abut on the abutment member 513, the heads of the lifting pins 512 protrude from the placement surface of the stage 505 and lift the wafer W from the placement surface of the stage 505.

The control device 520 opens the gate valve 518. Here, the wafer W placed on the lifting pins 512 is unloaded by the external transport mechanism 201 (see FIG. 3). When the transport mechanism 201 (see FIG. 3) comes out of the loading/unloading port 501*a*, the control device 520 closes the gate valve 518.

As described above, according to the processing apparatus 102 illustrated in FIG. 5, it is possible to perform predetermined processing, such as the processing of the step of forming the Ru film on the substrate (step S12).

Exemplary process conditions in the step of forming the Ru film on the substrate (step S12), which is executed by the processing apparatus 102, are as follows.

(Step S12)

Temperature of wafer W: 130 to 200 degrees C.

Pressure within main body container 501: 0.133 to 133 Pa

[Operation of Substrate Processing System]

Next, an exemplary operation of the substrate processing system will be described.

First, the overall controller 700 opens the gate valve G31, and controls the transport mechanism 402 to transport a wafer W accommodated in, for example, a carrier C in the load port 601 to the load-lock chamber 301. The overall controller 700 closes the gate valve G31, and sets the inside of the load-lock chamber 301 to a vacuum atmosphere.

The overall controller 700 opens the gate valves G11 and G21, and controls the transport mechanism 201 to transport the wafer W in the load-lock chamber 301 to the processing apparatus 101. The overall controller 700 closes the gate valves G11 and G21 and performs the step of exposing the wafer W to the silicon-containing gas (step S11) in the processing apparatus 101 by operating the processing apparatus 101.

Subsequently, the overall controller 700 opens the gate valves G11 and G12, and controls the transport mechanism 201 to transport the wafer W processed in the processing apparatus 101 to the processing apparatus 102. The overall controller 700 closes the gate valves G11 and G12 and operates the processing apparatus 102 to perform the step of forming the Ru film on the wafer W (step S12) in the processing apparatus 102.

Subsequently, the overall controller 700 opens the gate valves G12 and G11, and controls the transport mechanism 201 to transport the wafer W processed in the processing apparatus 102 to the processing apparatus 101. The overall controller 700 closes the gate valves G12 and G11 and performs the step of exposing the Ru film to the silicon-containing gas (step S13) in the processing apparatus 103 by operating the processing apparatus 101.

Subsequently, the overall controller 700 controls the transport mechanism 201 to transport the wafer W processed in the processing apparatus 101 to, for example, the load-lock chamber 303. The overall controller 700 sets the inside of the load-lock chamber 303 to an air atmosphere. The overall controller 700 opens the gate valve G33, and controls the transport mechanism 402 to transport the wafer W in the load-lock chamber 303 to, for example, the carrier C in the load port 603 so as to accommodate the wafer W in the carrier C.

As described above, according to the substrate processing system illustrated in FIG. 3, while a wafer W is being processed by each processing apparatus, predetermined processing may be performed on a wafer W without exposing the wafer W to the air, that is, without breaking vacuum.

In the above example, the case where the step of exposing the substrate to the silicon-containing gas (step S11), the step of forming the Ru film on the substrate (step S12), and the step of exposing the Ru film to the silicon-containing gas (step S13) are performed once in that order has been described, but the present disclosure is not limited thereto. For example, after the step of exposing the substrate to the silicon-containing gas (step S11), each of the step of forming the Ru film on the substrate (step S12) and the step of exposing the Ru film to the silicon-containing gas (step S13) may be repeated multiple times.

In the above example, the case in which the step of exposing the substrate to the silicon-containing gas (step S11) and the step of exposing the Ru film to the silicon-containing gas (step S13) are performed by the same processing apparatus 101 and the step of forming the Ru film on the substrate (step S12) is performed in the processing apparatus 102 different from the processing apparatus 101 has been described. However, the present disclosure is not limited thereto. For example, the step of exposing the substrate to the silicon-containing gas (step S11), the step of forming the Ru film on the substrate (step S12), and the step of exposing the Ru film to the silicon-containing gas (step S13) may be performed in the same processing apparatus. For example, the step of exposing the substrate to the silicon-containing gas (step S11), the step of forming the Ru film on the substrate (step S12) and the step of exposing the Ru film to the silicon-containing gas (step S13) may be performed in different processing apparatuses, respectively. In addition, the substrate may be exposed to the air between the step of exposing the substrate to the silicon-containing gas (step S11) and the step of forming the Ru film on the substrate (step S12). Further, the substrate may be exposed to the air between the step of forming the Ru film on the substrate (step S12) and the step of exposing the Ru film to the silicon-containing gas (step S13).

EXAMPLE

An example which was carried out in order to identify the effect of a RuSi film-forming method according to an embodiment will be described.

In the example, a Ru film was formed on a silicon oxide ($SiO_2$) film as an insulating film by performing steps S11 and S12 in the RuSi film-forming method described above using the processing apparatuses 101 and 102. In addition, as a comparative example, a Ru film was formed on a $SiO_2$ film as an insulating film by performing the step S12 using the processing apparatus 102 without performing step S11 in the RuSi film-forming method described above. The processing conditions of step S12 in the comparative example are the same as the processing conditions of step S12 in the example. In addition, in step S11, a method of continuously supplying a silicon-containing gas into the processing container was used, and in step S12, a method of continuously supplying a Ru-containing precursor into the processing container was used. In addition, in the example and the comparative example, the supply time of the Ru-containing precursor in step S12 was set to 10 seconds, 20 seconds, 30 seconds, and 60 seconds.

Figure 6A:
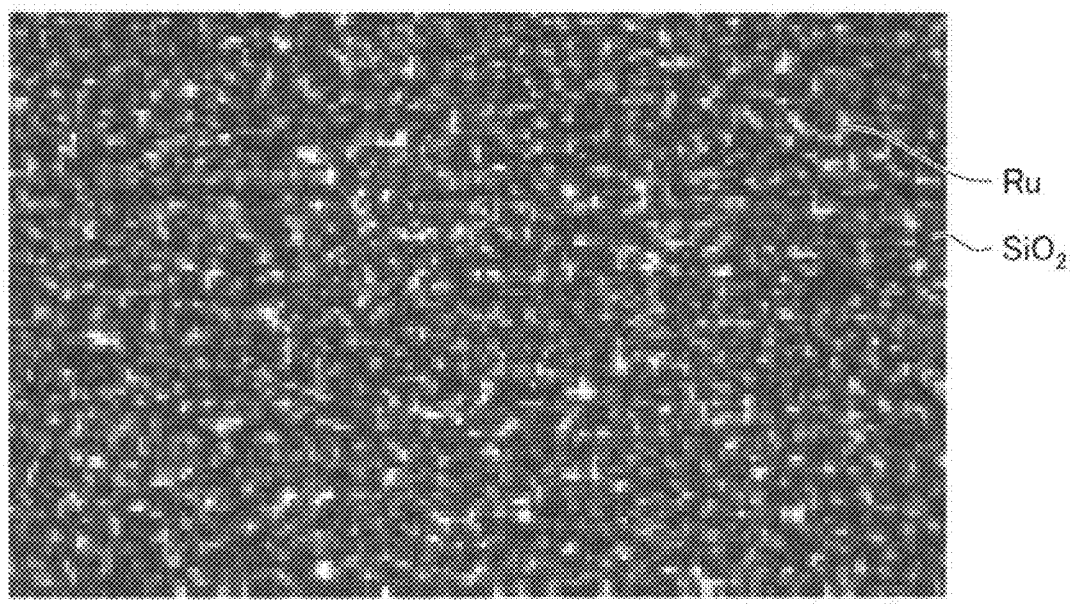
FIGS. 6A and 6B are views for describing an action obtained by causing silicon to be adsorbed on a surface of a $SiO_2$ film.
Figure 6B:
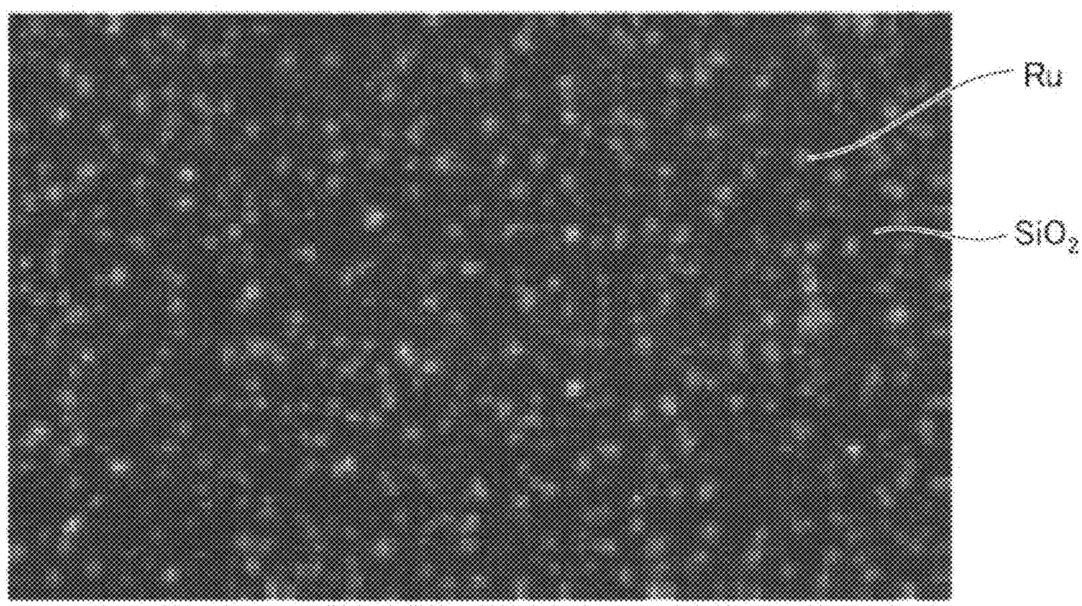

Subsequently, the state of the film surface of each Ru film formed in the example and the comparative example was observed using a scanning electron microscope (SEM). FIGS. 6A and 6B are views for describing an action obtained by causing silicon to be adsorbed on a surface of a $SiO_2$ film, and are SEM images of observing the surfaces of Ru films formed in the example and the comparative example. FIG. 6A shows the evaluation result when the supply time of the Ru-containing precursor in step S12 of the example was set to 10 seconds, and FIG. 6B shows the evaluation result when the supply time of the Ru-containing precursor in step S12 in the comparative example was set to 10 seconds. In each of FIG. 6A and FIG. 6B, the white areas represent a Ru film and the black areas represent a $SiO_2$ film. In addition, the ratio of the $SiO_2$ film covered with the Ru film (hereinafter, referred to as "coverage") was calculated by performing image processing on each of the SEM images by a known image processing technique.

As illustrated in FIG. 6A, in the example in which the Ru film was formed by exposing the $SiO_2$ film to the silicon-containing gas and then supplying the Ru-containing precursor for 10 seconds, the nucleation density of Ru was high and the coverage was 19.8%. Meanwhile, as illustrated in FIG. 6B, in the comparative example in which the Ru film was formed by supplying the Ru-containing precursor for 10 seconds without exposing the $SiO_2$ film to the silicon-containing gas, the nucleation density of Ru was low and the coverage was 13.8%. In addition, in the example, the coverages when the supply time of the Ru-containing precursor was set to 20 seconds and 30 seconds were 49.3% and 90.3%, respectively. Meanwhile, in the comparative example, the coverages when the supply time of the Ru-containing precursor was set to 20 seconds and 30 seconds were 48.3% and 62.0%, respectively. From these results, it can be said that by exposing the $SiO_2$ film to the silicon-containing gas and then supplying the Ru-containing precursor to form the Ru film, it is possible to make the coverage higher than that in the case of forming the Ru film by supplying the Ru-containing precursor without exposing the $SiO_2$ film to the silicon-containing gas.

In addition, the film thickness of each Ru film formed in the example and the comparative example was measured using an X-ray fluorescence (XRF) method. Further, based on the supply time of a Ru-containing precursor and the measured film thickness of each Ru film, a time delay until the formation of the Ru film was started after the start of the supply of the Ru-containing precursor (hereinafter, referred to as an "incubation time") was evaluated.

Figure 7:
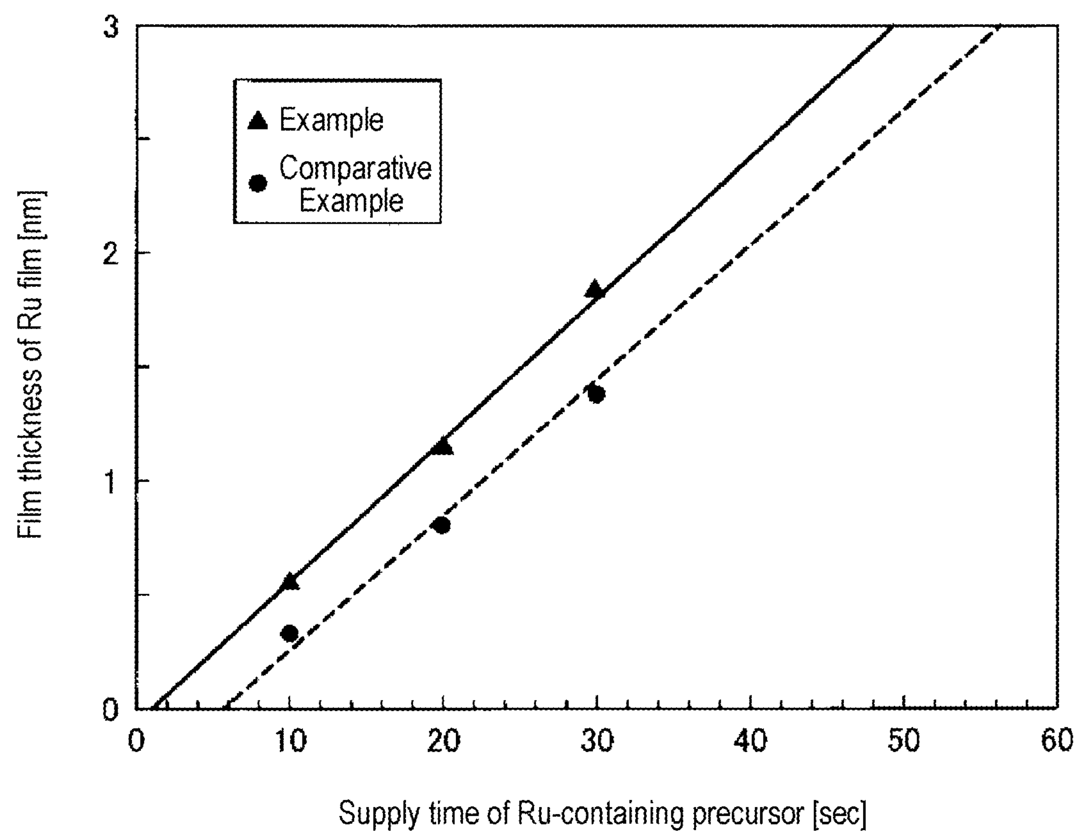
FIG. 7 is a diagram showing the relationship between a supply time of a Ru-containing precursor and a film thickness of a Ru film.

FIG. 7 is a diagram showing the relationship between a supply time of a Ru-containing precursor and a film thickness of a Ru film. In FIG. 7, the horizontal axis represents the supply time [seconds] of the Ru-containing precursor in step S12, and the vertical axis represents the film thickness [nm] of the Ru film measured using the XRF method. In addition, in FIG. 7, the results of the example are indicated by triangles, and the results of the comparative example are indicated by circles.

As illustrated in FIG. 7, it can be seen that the incubation time is about 1 second in the example, whereas the incubation time is about 6 seconds in the comparative example. From these results, it can be said that by exposing the $SiO_2$ film to the silicon-containing gas and then supplying the Ru-containing precursor to form the Ru film, it is possible to make the incubation time shorter than that in the case of forming the Ru film by supplying the Ru-containing precursor without exposing the $SiO_2$ film to the silicon-containing gas.

According to the evaluation results of the SEM images, the coverages, and the incubation times explained above, it is considered that a silicon film functions as an adsorption site for a Ru-containing precursor. In this way, since the silicon film functions as an adsorption site for a Ru-containing precursor, it is possible to form a continuous Ru film on an insulating film even when a designed film thickness is small.

According to the present disclosure, it is possible to form a RuSi film having good step coverage.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of forming a RuSi film, the method comprising:

adsorbing silicon in a recess that is formed in a substrate and includes an insulating film by supplying a silicon-containing gas to the substrate;

forming a Ru film in the recess by supplying a Ru-containing precursor to the recess in which the silicon is adsorbed; and forming a RuSi film by supplying a silicon-containing gas to the recess in which the Ru film is formed and by reacting the Ru film with the silicon-containing gas, wherein the forming the Ru film and the forming the RuSi film are performed alternately and repeatedly, the adsorbing the silicon and the forming the Ru film are performed within separate processing containers connected through a vacuum transport chamber, the adsorbing the silicon and the forming the RuSi film are performed within a same processing container, the adsorbing the silicon is performed within a first processing container of a processing apparatus, which includes a first stage configured to support the substrate in the first processing container and a first heater embedded in the first stage to heat the substrate, the forming the Ru film is performed within a second processing container of a chemical vapor deposition apparatus, which is different from the processing apparatus and includes a second stage configured to support the substrate and a second heater provided inside the second stage to heat the substrate, the adsorbing the silicon and the forming the RuSi film are performed at a same temperature by an output of the first heater, the adsorbing the silicon and the forming the Ru film are performed at different temperatures, the adsorbing the silicon and the forming the RuSi film are performed at a temperature of 300 to 500 degrees C., the forming the Ru film is performed at a temperature of 150 to 200 degrees C., the silicon-containing gas is $SiH_4$ gas, and the Ru-containing precursor is $Ru_3(CO)_{12}$.

2. The method of claim 1, wherein the forming the RuSi film is performed in a state in which the substrate is heated.

3. The method of claim 1, wherein, in the adsorbing the silicon and the forming the RuSi film, the silicon-containing gas is simultaneously supplied from a plurality of gas supply lines.

4. The method of claim 1, wherein, in the adsorbing the silicon and the forming the RuSi film, the silicon-containing gas is alternately supplied from a plurality of gas supply lines.

* * * * *